United States Patent
Lee et al.

(10) Patent No.: US 10,284,198 B2
(45) Date of Patent: May 7, 2019

(54) MEMORY SYSTEMS WITH ZQ GLOBAL MANAGEMENT AND METHODS OF OPERATING SAME

(71) Applicant: Samsung Electronics Co., Ltd., Suwon-si, Gyeonggi-do (KR)

(72) Inventors: Sang-Yeol Lee, Suwon-si (KR); Seokil Kim, Hwaseong-si (KR); Hoiju Chung, Yongin-si (KR); Yongjae Shin, Seoul (KR); YouKeun Han, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 29 days.

(21) Appl. No.: 15/282,291

(22) Filed: Sep. 30, 2016

(65) Prior Publication Data
US 2017/0099050 A1    Apr. 6, 2017

Related U.S. Application Data

(63) Continuation of application No. 62/236,321, filed on Oct. 2, 2015.

(30) Foreign Application Priority Data

Nov. 12, 2015   (KR) .................. 10-2015-0158992

(51) Int. Cl.
   *H03K 19/00*   (2006.01)
   *G11C 7/10*    (2006.01)

(52) U.S. Cl.
   CPC ....... *H03K 19/0005* (2013.01); *G11C 7/1057* (2013.01); *G11C 2207/2254* (2013.01)

(58) Field of Classification Search
   None
   See application file for complete search history.

(56) References Cited

U.S. PATENT DOCUMENTS

| | | | |
|---|---|---|---|
| 5,025,252 A | * | 6/1991 | DeLuca ................ G08B 5/227 340/4.51 |
| 6,807,650 B2 | | 10/2004 | Lamb et al. |
| 7,088,127 B2 | | 8/2006 | Ngyuen et al. |
| 7,528,626 B2 | | 5/2009 | Kim et al. |
| 7,969,182 B2 | | 6/2011 | Kim et al. |
| 8,019,919 B2 | | 9/2011 | Gower et al. |
| 8,272,781 B2 | | 9/2012 | Nale |
| 9,077,332 B2 | | 7/2015 | Ko |

(Continued)

FOREIGN PATENT DOCUMENTS

WO    WO 2005087518 A1 *  9/2005  .......... B60C 23/0416

*Primary Examiner* — Crystal L Hammond
(74) *Attorney, Agent, or Firm* — Myers Bigel, P.A.

(57) ABSTRACT

A memory system includes a memory module and a memory controller. The memory module includes a plurality of memory devices with corresponding ZQ calibration circuits therein. The memory controller, which is electrically coupled to the memory module, includes a ZQ global managing circuit therein. This ZQ global managing circuit is configured to determine a plurality of calibration values associated the corresponding ZQ calibration circuits in the plurality of memory devices, in response to calibration result data generated by the plurality of ZQ calibration circuits. The memory module is mounted within a memory slot. In addition, the plurality of calibration values account for signal loading characteristics of the memory module within the memory slot.

19 Claims, 12 Drawing Sheets

(56) References Cited

U.S. PATENT DOCUMENTS

| | | | | |
|---|---|---|---|---|
| 9,100,319 B2* | 8/2015 | Guo | ................... | H04L 45/121 |
| 9,582,347 B2* | 2/2017 | Helgeson | ............ | G06F 11/0709 |
| 9,608,630 B2* | 3/2017 | Hollis | ................ | H03K 19/0005 |
| 9,608,631 B2* | 3/2017 | Lee | ................... | H03K 19/0005 |
| 9,620,030 B2* | 4/2017 | Peterson | ................ | G09B 19/00 |
| 9,748,956 B2* | 8/2017 | Lee | ............... | H03K 19/017545 |
| 10,013,341 B2* | 7/2018 | Kwon | ................... | G06F 3/0604 |
| 2005/0040349 A1* | 2/2005 | Kum | ................... | G11B 17/225 |
| | | | | 250/559.29 |
| 2008/0031610 A1* | 2/2008 | Border | .............. | H04N 5/23212 |
| | | | | 396/89 |
| 2009/0009212 A1 | 1/2009 | Brox | | |
| 2010/0005212 A1* | 1/2010 | Gower | ............... | G06F 13/4234 |
| | | | | 710/308 |
| 2010/0283503 A1* | 11/2010 | Hollis | ............... | H03K 19/0005 |
| | | | | 326/30 |
| 2011/0283060 A1 | 11/2011 | Ware et al. | | |
| 2013/0113515 A1* | 5/2013 | Lee | ................... | H03K 19/0005 |
| | | | | 326/30 |
| 2013/0132779 A1* | 5/2013 | Smith | ................ | G06F 11/1076 |
| | | | | 714/42 |
| 2014/0266299 A1* | 9/2014 | Seol | ................... | H03K 19/0005 |
| | | | | 326/30 |
| 2014/0312953 A1* | 10/2014 | Song | ...................... | H04L 25/00 |
| | | | | 327/308 |
| 2014/0325135 A1* | 10/2014 | Anderson | ......... | H03K 19/0005 |
| | | | | 711/105 |
| 2015/0067292 A1* | 3/2015 | Grunzke | ............ | G06F 13/1694 |
| | | | | 711/170 |
| 2015/0348603 A1* | 12/2015 | Lee | ................... | H03K 19/0005 |
| | | | | 365/189.07 |
| 2016/0284386 A1* | 9/2016 | McCall | ................ | G11C 7/1057 |

\* cited by examiner

MEMORY SYSTEMS WITH ZQ GLOBAL MANAGEMENT AND METHODS OF OPERATING SAME

REFERENCE TO PRIORITY APPLICATIONS

This U.S. non-provisional patent application claims priority under 35 U.S.C. § 119 from U.S. Provisional Patent Application No. 62/236,321, filed Oct. 2, 2015 and Korean Patent Application No. 10-2015-0158992, filed Nov. 12, 2015, the disclosures of which are hereby incorporated herein by reference in their entirety.

BACKGROUND

Embodiments of the inventive concept described herein relate to memory systems and, more particularly, to memory systems that utilize memory controllers to perform ZQ global management.

Semiconductor memory devices within memory systems may be connected to a memory controller using transmission lines for transmitting signals such as data, addresses and commands. The signals transmitted through the transmission lines may be reflected at ends of the transmission lines. The reflected signals typically act as noise that degrades the fidelity of the original signals, thereby causing a decrease in signal integrity (SI).

To prevent signal reflections, termination resistors may be connected to the termination node of the transmission line. A termination resistor may serve to match impedance between an inside and an outside of a semiconductor memory device. Termination resistors are commonly used in dynamic random access memory (DRAM), which has a fast operating speed. To prevent signal interference between DRAMs, an on die termination (ODT) technique can be utilized by including termination resistors, which are directly connected on a die of the DRAM. In the case of double data rate 3 synchronous DRAM (DDR3 SRAM), which has a fast operating speed above 1000 MHz, even higher signal integrity and reliability may be required. Thus, when impedance matching is not exactly performed due to a change in termination resistance caused by process, voltage, and temperature (i.e., PVT) variations, it may be difficult to rapidly transmit signals and such signals may become degraded.

A conventional DDR3 SDRAM may utilize a ZQ calibration circuit to secure high signal integrity and stability. When the termination resistance value is precisely calibrated based on a calibration code generated from the ZQ calibration circuit, the impedance matching may be accurately made in the memory system.

As will be understood by those skilled in the art, there are typically two different calibration commands in DDR3 that are used to account for variations in the system environment for temperature, voltage and component drift. The ZQ calibration commands operate to calibrate the DRAM's output drivers and ODT values by typically using a precision 240 ohm (±1%) resistor connected from the DRAM's ZQ pin to ground. However, because a ZQ calibration long (ZQCL) command typically takes 512 clocks to complete, it is often used during power-up initialization and reset. Subsequent ZQCL commands can be issued at any time the DRAM is idle and typically only require 246 clocks. In contrast, a ZQ calibration short (ZQCS) command typically requires 64 clocks to complete, so it is used periodically when the DRAM is idle to perform calibrations to account for minor variations in voltage and temperature. Each ZQCS command can typically correct a minimum of 0.5% impedance error within 64 clocks. Both ZQCL and ZQCS can be initiated at any time and as often as required by the BIOS and memory controller to account for larger changes in the system environment. The ZQCL command is typically used when there is more impedance error correction required than a ZQCS can provide.

SUMMARY

Embodiments of the inventive concept provide a memory system capable of performing ZQ global management operations under a control of a memory controller.

Some embodiments of the inventive concept are directed to a memory system including a memory module mounted on a memory slot. The memory system includes a plurality of semiconductor memory devices each having a ZQ calibration circuit, and a memory controller configured to control the memory module. The memory controller may include a ZQ global managing circuit configured to receive calibration result data of the ZQ calibration circuit through the memory slot and to determine a final calibration value of the ZQ calibration circuit based on a signal loading characteristic of the memory slot on which the memory module is mounted.

Additional embodiments of the inventive concept are directed to provide a memory system including a memory module comprising a plurality of semiconductor memory devices each having a ZQ calibration circuit and mounted on one of a plurality of memory slots installed on a circuit board, and a memory controller configured to control the plurality of semiconductor memory devices in the memory module for each rank. The memory controller may include a ZQ global managing circuit configured to receive calibration result data of the ZQ calibration circuit through one of the plurality of memory slots and to determine a final calibration value for a ZQ fine control of the ZQ calibration circuit based on a signal loading characteristic for each rank position in the memory module.

According to further embodiments of the invention, a memory system is provided, which includes a memory module and a memory controller. The memory module includes a plurality of memory devices with corresponding ZQ calibration circuits therein. The memory controller, which is electrically coupled to the memory module, includes a ZQ global managing circuit therein. This ZQ global managing circuit is configured to determine a plurality of calibration values associated the corresponding ZQ calibration circuits in the plurality of memory devices, in response to calibration result data generated by the plurality of ZQ calibration circuits. Typically, the memory module is mounted within a memory slot. In addition, the plurality of calibration values account for signal loading characteristics of the memory module within the memory slot.

In some of these embodiments of the invention, the calibration result data for each of the plurality of memory devices includes a pull-up calibration code and a pull-down calibration code. In additional embodiments of the invention, the memory controller is configured to transmit the plurality of calibration values to the ZQ calibration circuits within the plurality of memory devices. In other embodiments of the invention, the calibration result data is modified by the plurality of calibration values and then used during an on-die termination operation associated with on-die termination circuits.

According to still further embodiments of the invention, the ZQ global managing circuit includes a signal integrity register, which is configured to store signal integrity information based on signal loading characteristics of the memory slot, and a ZQ code register, which is configured to store the plurality of calibration values. The ZQ global managing circuit further includes a ZQ global control circuit, which is configured to determine the plurality of calibration values from at least the signal integrity information and the calibration result data. The ZQ global managing circuit may also include a variable offset resistance device electrically coupled to a calibration node. This variable offset resistance device may include a variable pull-up resistor connected to the calibration node and a variable pull-down resistor connected to the calibration node.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
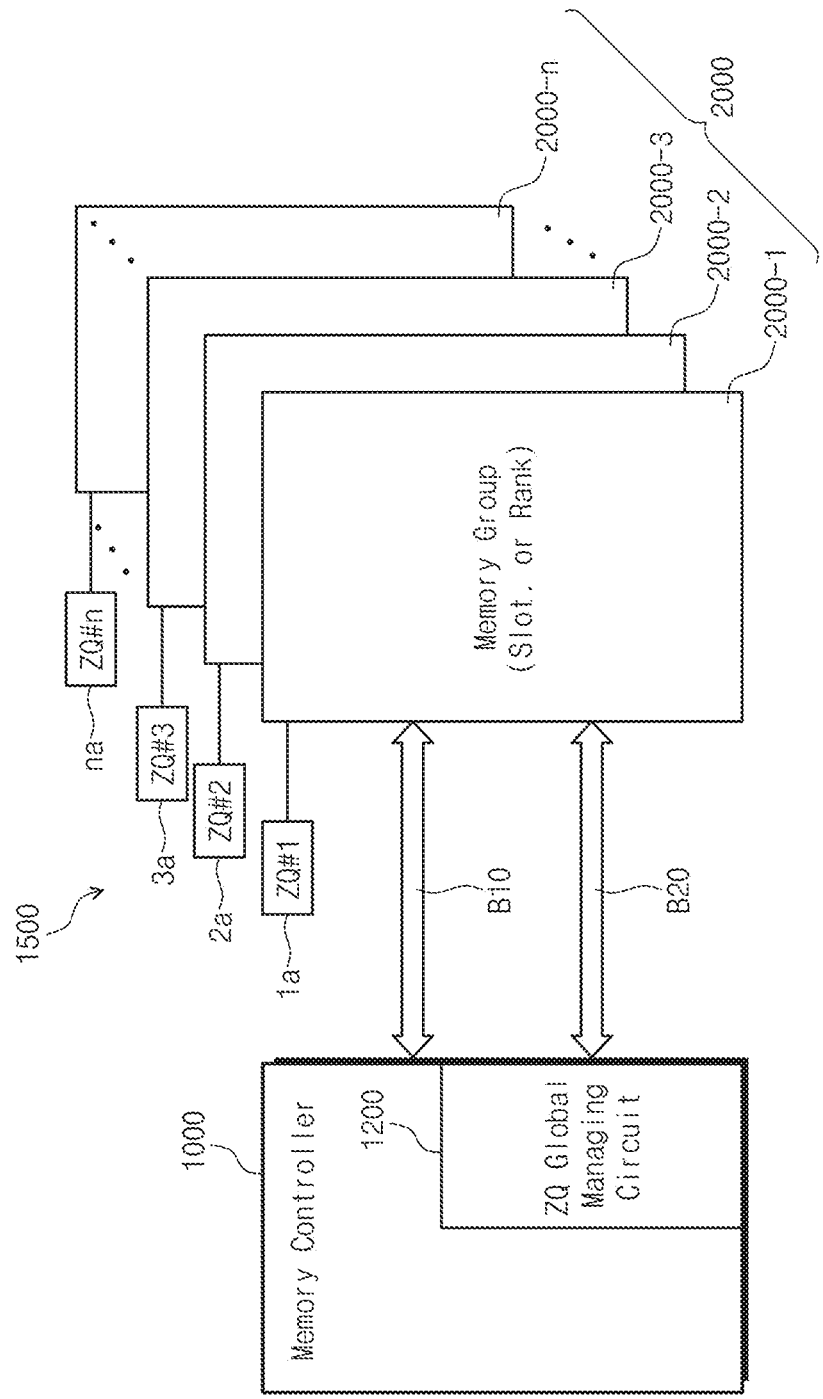
FIG. 1 is a block diagram illustrating a memory system according to an embodiment of the inventive concept.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An embodiment described and illustrated herein may be included in its complementary embodiments, details regarding a ZQ calibration circuit and an on die functional circuit for performing a basic operation and such a basic operation of the termination circuit are not described in detail herein to avoid the subject matter of the present invention from being obscured.

FIG. 1 is a block diagram illustrating a memory system according to an embodiment of the inventive concept. Referring to FIG. 1, a memory system 1500 may include a memory controller 1000 and memory groups 2000. Each of the memory groups 2000-1 to 2000-*n* may include a memory module. Here, n may be an integer of 2 or more. The memory module may include a plurality of semiconductor memory devices. The memory module may be mounted on a memory slot and may include a plurality of semiconductor memory devices each having a ZQ calibration circuit. The memory controller 1000 may control the memory module. The memory controller 1000 may include a ZQ global managing circuit 1200 which receives data of a calibration result of the ZQ calibration circuit through the memory slot and determines a final calibration value of the ZQ calibration circuit based on a signal loading characteristic of the memory slot on which the memory module is mounted.

A bus B10 connected between the memory controller 1000 and the memory groups 2000 may be a command/address bus (C/A BUS). A bus B20 connected between the memory controller 1000 and the memory groups 2000 may be a data bus.

The calibration result data may be provided to the ZQ global managing circuit 1200 through the bus B20. ZQ resistance units 1*a* to n*a* may be connected to the memory groups 2000-1 to 2000-*n*, respectively, where "n" is an integer greater than two. It may be assumed that a memory slot on which the second memory group 2000-2 is mounted is further from the memory controller 1000 than a memory block on which the first memory group 2000-1 is mounted. With this assumption, a signal loading characteristic difference between the first and second memory slots may exist. For this reason, even though ZQ calibration is performed, there may be a need to perform fine ZQ calibration based on the signal loading characteristic difference. Therefore, the ZQ global managing circuit 1200 according to an embodiment of the inventive concept may determine a final calibration value of the ZQ calibration circuit and may transmit the determined calibration value to a semiconductor memory device in a corresponding memory group.

Figure 2:
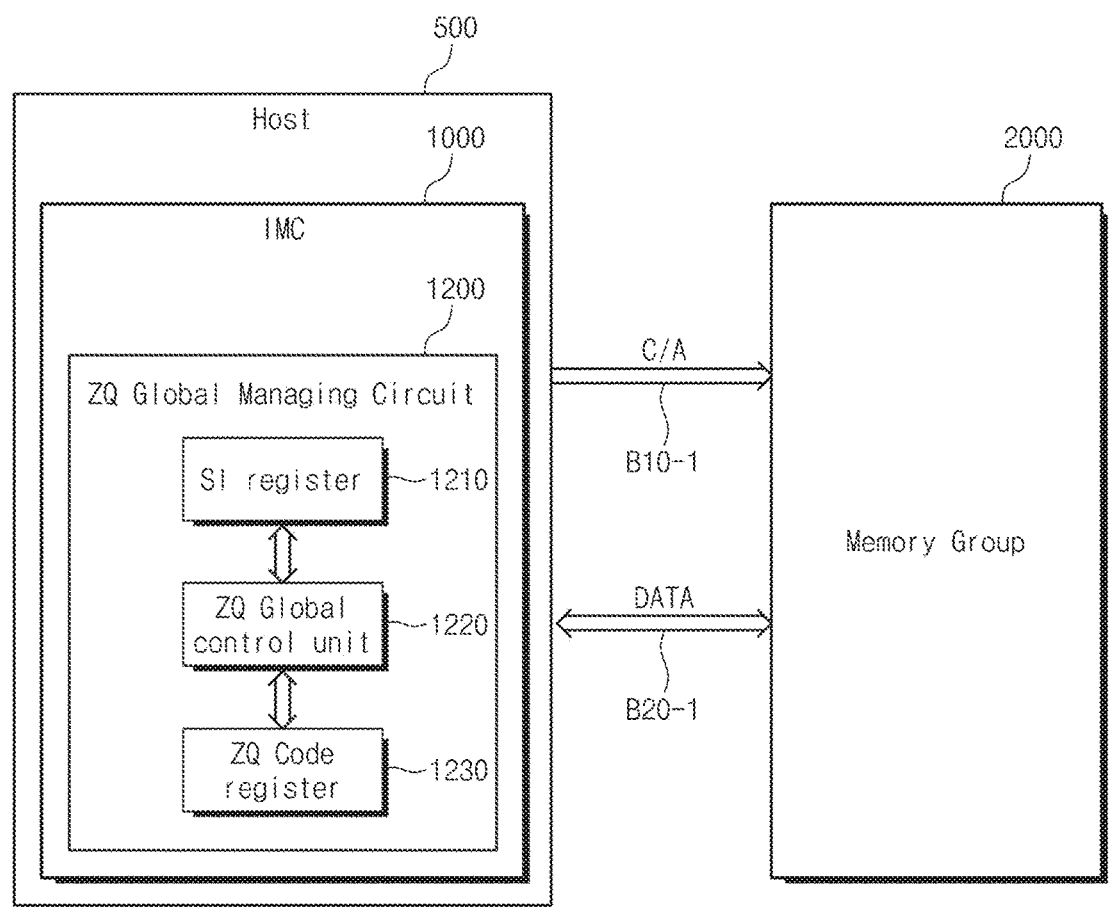
FIG. 2 is a detailed block diagram illustrating a memory controller of FIG. 1.

FIG. 2 is a detailed block diagram illustrating the memory controller of FIG. 1. Referring to FIG. 2, the memory controller 1000 may be an internal memory controller IMC included in a host 500 for processing data based on a program. The host 500 may execute various computing functions as executing specific software to perform specific calculations or tasks. For example, the host 500 may be a microprocessor or a central processing unit (CPU). The host 500 may be connected to the internal memory controller 1000 through a processor bus including an address bus, a control bus and/or a data bus.

The ZQ global managing circuit 1200 included in the memory controller 1000 may include a signal integrity (SI) register 1210, a ZQ global control unit 1220, and a ZQ code register 1230, connected as illustrated. The signal integrity (SI) register 1210 may store information of signal integrity (SI) according to a signal loading characteristic of a memory slot. The ZQ code register 1230 may store a final calibration value. The ZQ global control unit 1220 may determine the final calibration value using the SI information and calibration result data.

The memory controller 1000 may apply a calibration command to a memory group 2000 through a command/address B10-1. The memory controller 1000 may receive the calibration result value from the memory group 2000 through a data bus B20-1. The memory controller 1000 may provide the final calibration value to the memory group 2000 through the data bus B20-1 based on the received calibration result value.

Figure 3:
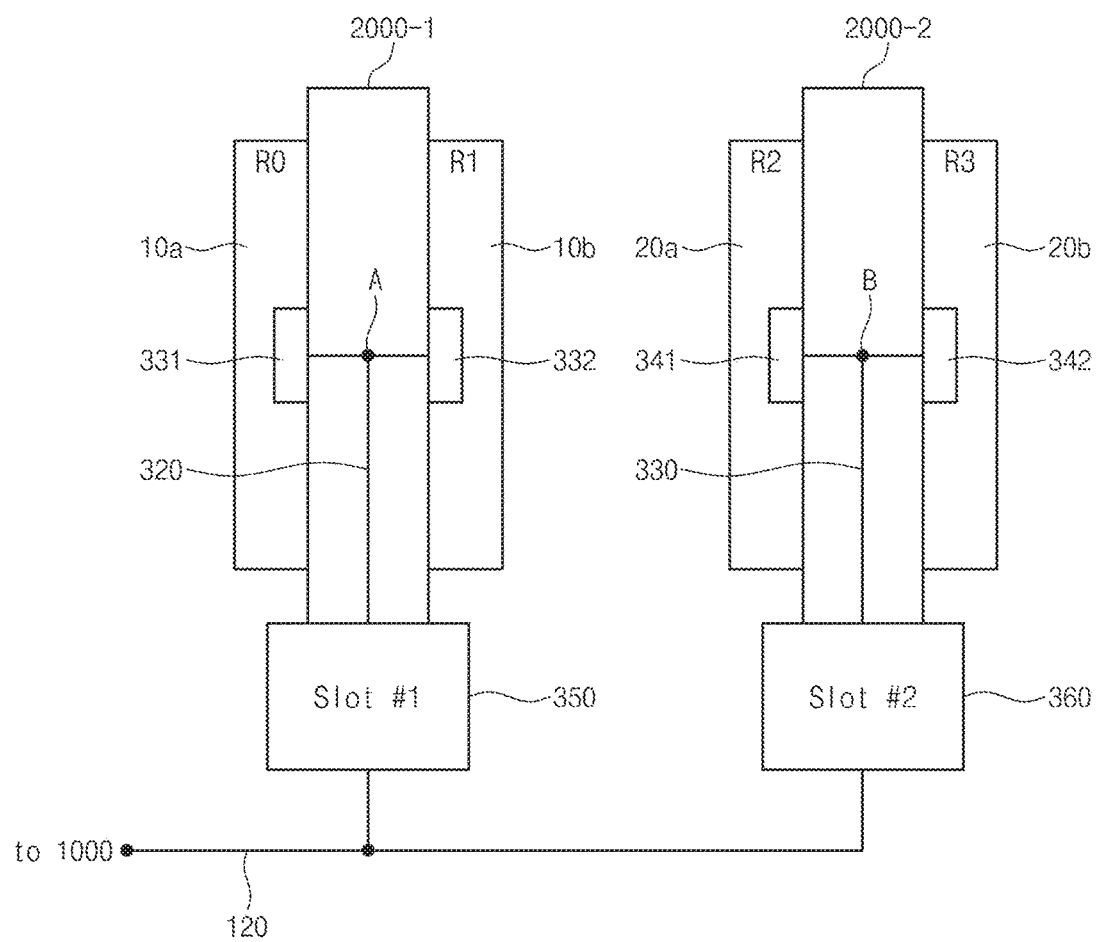
FIG. 3 is a diagram illustrating an example in which memory modules of memory groups of FIG. 1 are respectively mounted on slots.

FIG. 3 is a diagram illustrating an example in which memory modules of memory groups of FIG. 1 are respectively mounted on slots. Referring to FIG. 3, two memory modules 2000-1 and 2000-2 may be mounted on first and second memory slots 350 and 360, respectively. A line 120 connected to the first and second slots 350 and 360 may be connected to the memory controller 1000. The memory controller 1000 may also be called a chip set. The line 120 may include a data bus and a control bus. The control bus may refer to a bus for transmitting a control signal such as a clock signal, a command, or an address signal. The data bus may refer to a bus for transmitting data.

The memory modules 2000-1 and 2000-2, which each include a plurality of ranks, may be respectively mounted on the corresponding slots 350 and 360 and may be connected to the memory controller 1000 through the line 120. As illustrated above, each of the memory modules 2000-1 and 2000-2 may be a dual in-line memory module (DIMM) having two ranks. For example, the memory module 2000-1 may be a dual in-line memory module (DIMM) having two ranks [R0, R1], and the memory module 2000-2 may be a dual in-line memory module (DIMM) having two ranks [R2, R3]. However, the scope and spirit of the inventive concept may not be limited thereto. For example, each of the memory modules 2000-1 and 2000-2 may be a dual in-line memory module (DIMM) having four ranks or one rank. In this case, one rank may include at least one or more semiconductor memory devices (e.g., DRAMs).

The memory module 2000-1 may include on die termination (ODT) circuits [331, 332], and the memory module 2000-2 may include on die termination (ODT) circuits [341,342]. The ODT circuit may prevent data distortion due to reflection of data inputted/outputted when a normal operation such as a write or read operation about a semiconductor memory device included in a memory module is performed. As a result, the ODT circuit may be a termination matching circuit included in a semiconductor memory device.

The ODT circuit may be connected to a DQ pin or a DQ port of the semiconductor memory device. It may be assumed that other termination scheme is adapted and ranks R0 and R1 of the first memory module 2000-1 perform a write or read operation. With this assumption, the ODT circuits 341 and 342 of the second memory module 2000-2 may be turned on (or may be activated) in response to an activation of a first termination control signal transmitted through the line 120 and may perform a function of the termination matching circuit connected to the line 120. In this case, the ODT circuits 331 and 332 of the first memory module 2000-1 may be turned off (or may be inactivated) in response to a second termination control signal transmitted through the line 120. The first and second termination control signals may be applied from the memory controller 1000.

Alternatively, when the ranks R2 and R3 of the second memory module 2000-2 perform a write or read operation, operations of the ODT circuits [331, 332] and [341,342] may be opposite to the operations of the above-described ODT circuits. That is, the ODT circuits 341 and 342 of the second memory module 2000-2 may be turned off, and the ODT circuits 331 and 332 of the first memory module 2000-1 may be turned "on".

In FIG. 3, it may be assumed that the second memory slot 360 is further from the memory controller 1000 than the first memory slot 350. With this assumption, a signal loading characteristic difference may occur between the memory slots 350 and 360. Even though an on-die termination operation is performed as ZQ calibration is made, termination matching may not be accurately made due to the signal loading characteristic difference. Thus, the ZQ global managing circuit 1200 may determine the final calibration value of the ZQ calibration circuit and may transmit the determined final calibration value to a corresponding rank.

Figure 4:
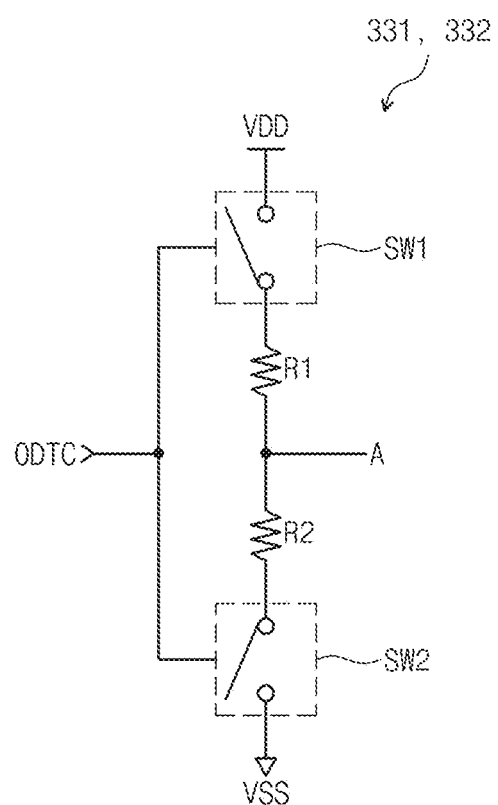
FIG. 4 is a diagram illustrating a termination circuit block of FIG. 3 according to an embodiment of the inventive concept.

FIG. 4 is a diagram illustrating a termination circuit block of FIG. 3 according to an embodiment of the inventive concept. Referring to FIG. 4, a first ODT circuit 331 may use a center tap termination (CTT) type. The first ODT circuit 331 may include switches SW1 and SW2 and termination resistors R1 and R2. The remaining ODT circuits 332, 341 and 342 may be also configured substantially the same as the first ODT circuit 331. Each of the switches SW1 and SW2 may be implemented with an MOS transistor. Each of the switches SW1 and SW2 may be turned on in response to an activation of a termination control signal ODTC. That is, the switches SW1 and SW2 may respectively supply a power voltage VDD and a ground voltage VSS to one ends of termination resistances R1 and R2, and thus the ODT circuit 331 may be turned on. The termination resistances R1 and R2 may have the same resistance value. A node A connected between the termination resistances R1 and R2 may be connected to a DQ pin of the semiconductor memory device included in the memory module 2000-1 illustrated in FIG. 3. Additional aspects of OTD circuits and ZQ calibration are disclosed un US 2011/0025373 to Kim et al., the disclosure of which is hereby incorporated herein by reference.

Figure 5:
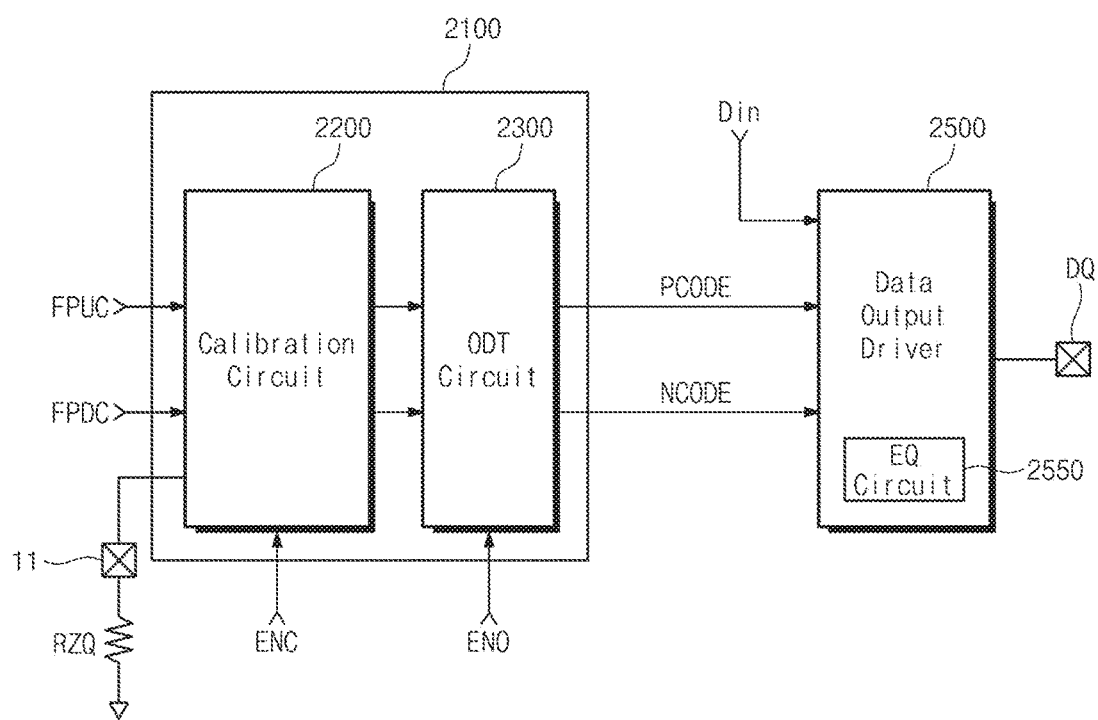
FIG. 5 is a block diagram illustrating a calibration and termination circuit implemented in a semiconductor memory device of FIG. 3.

FIG. 5 is a block diagram illustrating a calibration and termination circuit implemented in a semiconductor memory device of FIG. 3. Referring to FIG. 5, a calibration and termination circuit 2100 may include a calibration circuit 2200 and an on-die termination (ODT) circuit 2300. A ZQ pad 11 may be connected to the calibration circuit 2200, and a ZQ resistor RZQ may be connected to the ZQ pad 11 as an external resistor. That is, the ZQ resistor RZQ connected outside a semiconductor memory device chip may have, for example, a resistance value of 240Ω. A final pull-up control signal FPUC and a final pull-down control signal FPDC which are determined according to the final calibration value may be applied to the calibration circuit 2200. The final pull-up control signal FPUC or final pull-down control signal FPDC may be used to finely adjust a resistance value of the ZQ resistor RZQ.

The calibration circuit 2200 may perform a calibration operation in response to a calibration enable signal ENC. The ODT circuit 2300 may perform an ODT operation in response to an ODT enable signal ENO. A data output driver 2500 may drive an output terminal DQ, through which data Din is outputted, in response to a pull-up calibration code PCODE and a pull-down calibration code NCODE. The data output driver 2500 may include an equalizer circuit 2550.

In a memory system, a plurality of semiconductor memory devices may be connected in common to one line. An equalization scheme may be applied to the above-described bus structure to overcome the issue that a bandwidth is restricted by a transmission channel and to transmit a signal at high speed. A high-frequency component of an input data signal may be amplified or attenuated through the equalization scheme. When a driving force of the equalization operation is deviated from a preset value, a transfer impedance value may also be deviated from a normal impedance value. When the driving force is set to be low, a signal magnitude may become small, thereby making it difficult to determine a signal. The equalization operation may be performed by adjusting a capacitance. When the equalizer circuit 2550 is included in the semiconductor memory device according to an embodiment of the inventive concept, the driving force of the equalization operation may be applied in determining the final calibration value. Thus, ZQ calibration may be performed more finely.

Figure 6:
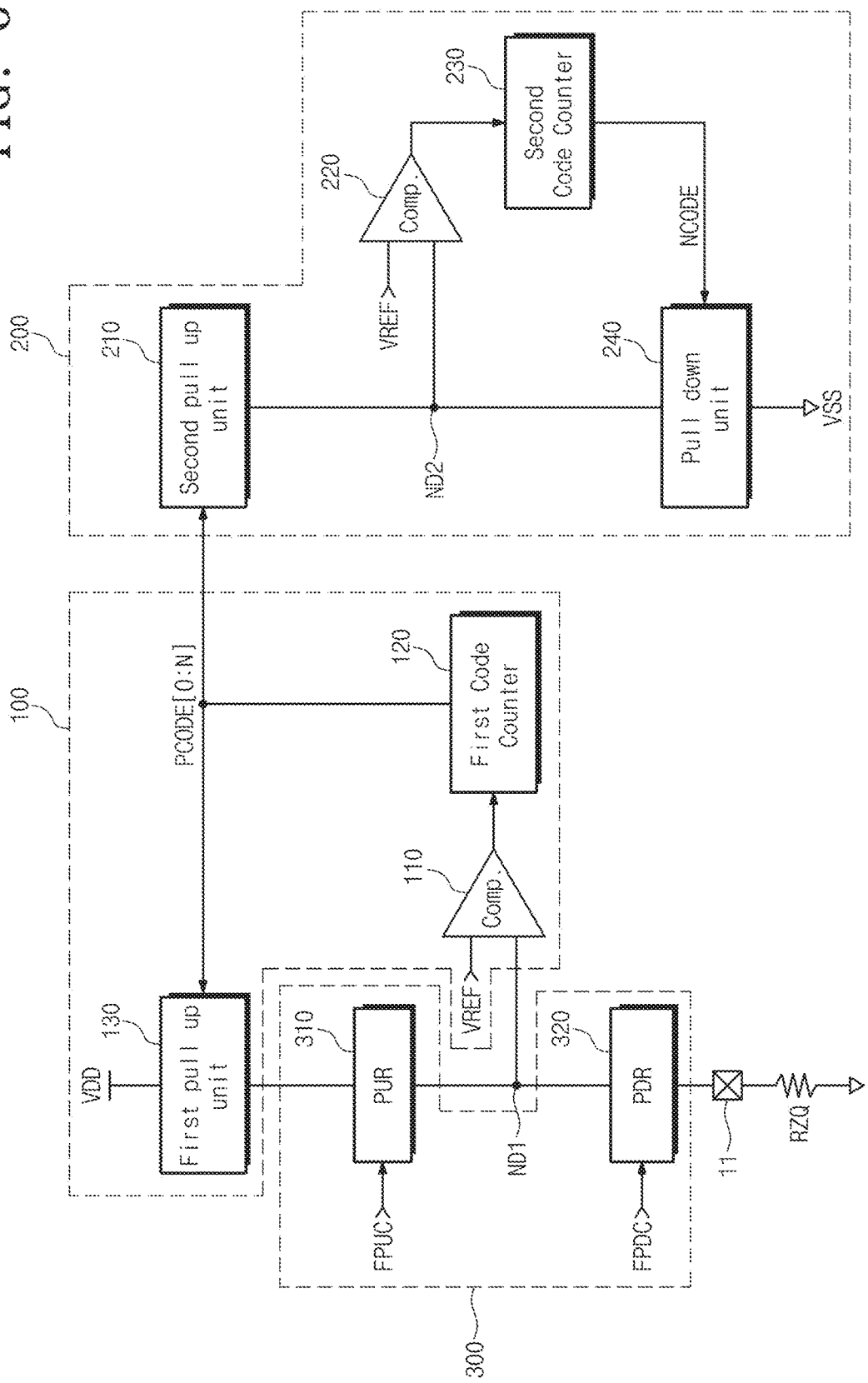
FIG. 6 is a detailed block diagram illustrating a calibration circuit of FIG. 5.

FIG. 6 is a detailed block diagram illustrating the calibration circuit of FIG. 5. Referring to FIG. 6, the calibration circuit 2200 may include a pull-up calibration code generator 100, a pull-down calibration code generator 200, and a fine ZQ adjustment unit 300. The pull-up calibration code generator 100 may include a first pull-up unit 130, a first comparator 110, and a first code counter 120.

The pull-down calibration code generator 200 may include a second pull-up unit 210, a second comparator 220, a second code counter 230, and a pull-down unit 240. The fine ZQ adjustment unit 300 may include a variable pull-up resistor 310 and a variable pull-down resistor 320 which are connected to a distribution voltage input terminal of the first comparator 110, for example, a first calibration node ND1. A final pull-up control signal FPUC may be a signal for adjusting a resistance value of the variable pull-up resistor 310. A final pull-down control signal FPDC may be a signal for adjusting a resistance value of the variable pull-down resistor 320.

When resistance values of the variable pull-up and pull-down resistors 310 and 320 are adjusted, a voltage level on the first calibration node ND1 may be changed. As a result, according to an embodiment of the inventive concept, once a ZQ calibration operation is performed, the memory controller 1000 may determine the final pull-up control signal FPUC or the final pull-down control signal FPDC, which are fit to a system environment, on the basis of a signal loading characteristic of a memory module or rank. Accordingly, a resistance value of the ZQ resistor RZQ may be adjusted to be fit to the signal loading characteristic of a memory slot, a memory module, or a rank placed on a circuit board.

A ZQ calibration may refer to a process for generating an impedance code as a process-voltage-temperature (PVT) condition varies. A code generated according to a ZQ calibration result may be used to adjust a termination resistance value. In general, a pad to which an external resistor used as a reference for calibration is connected may be known as a ZQ pad. For this reason, a term "ZQ calibration" may be often used.

When the fine ZQ adjustment unit 300 is at an initial state in which fine adjustment is not made, the first comparator 110 may receive a distribution voltage, which is generated by the ZQ resistor RZQ connected to the ZQ pad and the first pull-up unit 130, through the first calibration node ND1. The first comparator 110 may compare the distribution voltage of the first calibration node ND1 and a reference voltage VREF (e.g., VDD/2) and may generate an up/down signal (UP/DN) based on the compared result.

The first code counter 120 may generate a pull-up calibration code PCODE of (N+1) bits [0:N] in response to the up/down signal (UP/DN). Here, N may be an integer of 1 or more. A pull-up resistance value of the first pull-up unit 130 may be adjusted as the parallel resistors (i.e., each of the resistance values may be designed based on binary weight) of the first pull-up unit 130 are turned on/off by the pull-up calibration code PCODE. The adjusted pull-up resistance value of the first pull-up unit 130 may again have an influence on the distribution voltage of the first calibration node ND1, and the first comparator 110 may repeat the above-described operation. As a result, the pull-up calibration operation may be repeated until a resistance value of the first pull-up unit 130 is the same as the resistance value of the ZQ resistor RZQ.

The pull-up calibration code PCODE generated by the pull-up calibration operation may be inputted to the second pull-up unit 210, and thus the entire pull-up resistance value of the second pull-up unit 210 may be determined. Then, a pull-down calibration operation may start. As with the above pull-up calibration operation, the second comparator 220 may receive a distribution voltage, which is generated by the second pull-up unit 210 and the pull-down unit 240, through a second calibration node ND2. The second comparator 220 may compare the distribution voltage of the second calibration node ND2 and a reference voltage VREF and may generate an up/down signal (UP/DN) based on the compared result.

The second code counter 230 may generate a pull-down calibration code NCODE of (N+1) bits [0:N] in response to the up/down signal (UP/DN). A pull-down resistance value of the pull-down unit 240 may be adjusted as parallel resistors in the pull-down unit 240 are turned on/off by the pull-down calibration code NCODE. The adjusted resistance value of the pull-down unit 240 may again have an influence on a distribution voltage of the second calibration node ND2, and thus the second comparator 220 may repeat the above-described operation. As a result, the pull-down calibration operation may be repeated until a resistance value of the second pull-up unit 210 is the same as a resistance value of the pull-down unit 240. When the pull-down calibration operation is completed, a voltage of the second calibration node ND2 may be equal to the reference voltage VREF.

According to an embodiment of the inventive concept, when the pull-up and pull-down calibration operations described above are completed, the ZQ global managing circuit 1200 in the memory controller 1000 may receive the pull-up calibration code PCODE and the pull-down calibration code NCODE. The ZQ global managing circuit 1200 may determine a final calibration value based on a signal loading characteristic of a memory slot, a memory module, or a rank located on a circuit board. As a result, the pull-up calibration code PCODE and the pull-down calibration code NCODE may be generated by the ZQ global control unit 1220 and may be provided to a corresponding memory slot, memory module, or a rank. In this case, a fine ZQ calibration operation may be performed based on a signal loading characteristic difference. The calibration circuit 2200 of FIG. 6 may be an example, and the scope and spirit of the inventive concept may not be limited thereto.

Figure 7:
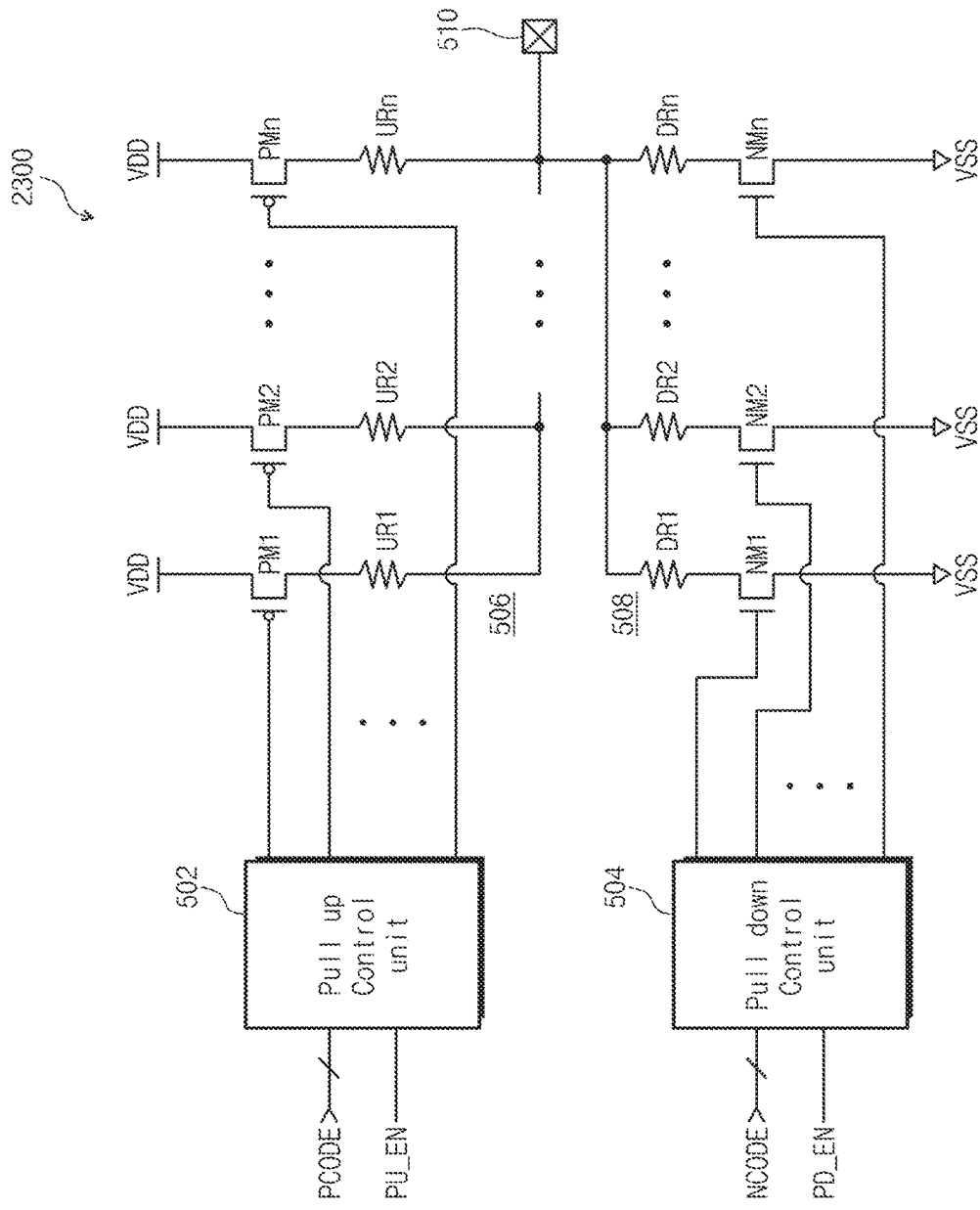
FIG. 7 is a detailed diagram illustrating an on-die termination (ODT) circuit of FIG. 5.

FIG. 7 is a detailed diagram illustrating an on-die termination (ODT) circuit of FIG. 5. Referring to FIG. 7, the on-die termination (ODT) circuit 2300 may include a pull-up control unit 502, a pull-down control unit 504, a pull-up termination unit 506, and a pull-down termination unit 508.

The on-die termination circuit 2300 may terminate an interface pad 510 in response to pull-up and pull-down calibration codes PCODE and NCODE generated from the calibration circuit 2200. In this case, the interface pad 510 may be a data output pad DQ.

The pull-up termination unit 506 may be implemented to be similar to the first pull-up unit 130. As a result, since a resistance value of the pull-up termination unit 506 is determined by the pull-up calibration code PCODE, the pull-up termination unit 506 and the first pull-up unit 130 may be designed to be the same as or similar to each other. An operation of the pull-up termination unit 506 may be described hereinafter.

The pull-up control unit 502 may control the pull-up termination unit 506 in response to the pull-up calibration code PCODE and a pull-up enable signal PU_EN. The pull-up enable signal PU_EN may be a signal for turning on/off the pull-up termination unit 506. When the pull-up enable signal PU_EN is activated, resistors UR1 to URn in the pull-up termination unit 506 may be turned on/off based on the pull-up calibration code PCODE. When the pull-up enable signal PU_EN is inactivated, the pull-up termination unit 506 may not operate regardless of the pull-up calibration code PCODE. That is, all the resistors UR1 to URn in the pull-up termination unit 506 may be turned off.

The pull-down termination unit 508 may be designed to be similar to the pull-down unit 240. As a result, since a resistance value of the pull-down termination unit 508 is determined by the pull-down calibration code NCODE, the pull-up termination unit 508 and the pull-down unit 240 may be designed to be the same or at least very similar to each other. An operation of the pull-down termination unit 508 may be described hereinafter.

The pull-down control unit 504 may control the pull-down termination unit 508 in response to the pull-down calibration code NCODE and a pull-down enable signal PD_EN. The pull-down enable signal PU_EN may be a signal for turning on/off the pull-down termination unit 508. When the pull-down enable signal PD_EN is activated, resistors DR1 to DRn in the pull-down termination unit 508 may be turned on/off based on the pull-down calibration code NCODE. When the pull-down enable signal PD_EN is inactivated, the pull-down termination unit 508 may not operate regardless of the pull-down calibration code NCODE.

The on-die termination circuit 2300 may function as a main driver of the data output driver 2500. When the pull-up termination unit 506 is activated by the pull-up enable signal PU_EN, the pull-up termination unit 506 may change a level of the interface pad 510 into a high level. Thus, data of 'high' may be outputted through the interface pad 510. On the other hand, when the pull-down termination unit 508 is activated by the pull-down enable signal PD_EN, the pull-down termination unit 508 may change a level of the interface pad 510 to a low level. Thus, data of 'low' may be outputted through the interface pad 510.

Figure 8:
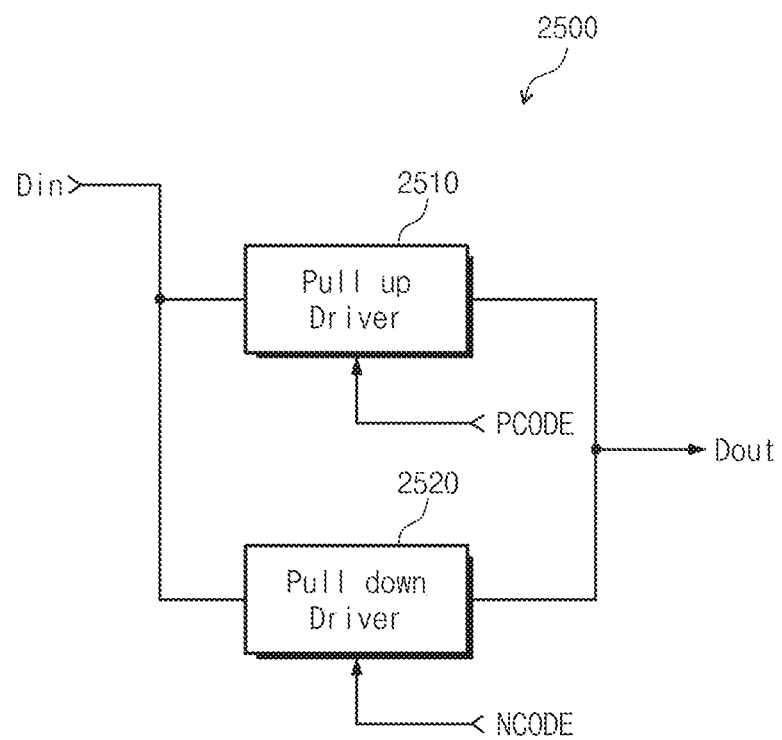
FIG. 8 is a detailed block diagram illustrating a data output driver of FIG. 5.

FIG. 8 is a detailed block diagram illustrating a data output driver of FIG. 5. Referring to FIG. 8, the data output driver 2500 may include a pull up driver 2510 and a pull down driver 2520. The pull up driver 2510 may be implemented to be the same as or similar to the pull-up termination unit 506 of FIG. 7. When input data Din is 'high', the pull up driver 2510 may control data driving force about a data output terminal Dout based on the pull-up calibration code PCODE. The pull down driver 2520 may be implemented to be the same as or similar to the pull-down termination unit 508 of FIG. 7. When the input data Din is 'low', the pull down driver 2520 may control data driving force about the data output terminal Dout based on the pull-down calibration code NCODE. The data output driver 2500 of FIG. 8 may be an example embodiment. However, the scope and spirit of the inventive concept may not be limited thereto.

Figure 9:
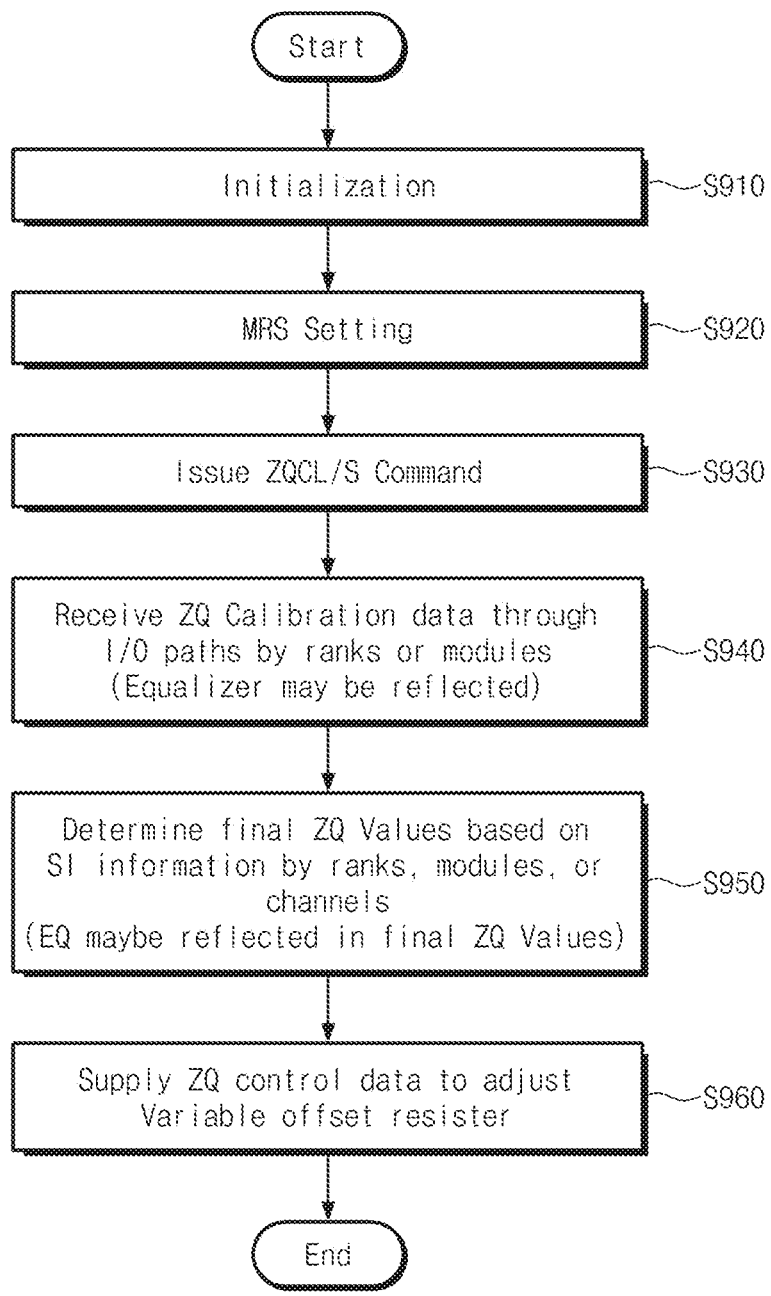
FIG. 9 is a flowchart illustrating a ZQ global managing control method according to an embodiment of the inventive concept.

FIG. 9 is a flowchart illustrating a ZQ global managing control method according to an embodiment of the inventive concept. Referring to FIG. 9, at S910, the ZQ global managing circuit 1200 may perform an initialization operation. An internal state value of a buffer in a selected memory module as well as a stored value of the ZQ code register 1230 may also be initialized by the initialization operation. At S920, a MRS setting operation may be performed in the semiconductor memory device by issuing a MRS command. ZQ calibration result data may be outputted through I/O paths of the semiconductor memory device for each rank or for each module based on the MRS setting operation.

At S930, The ZQ global managing circuit 1200 may issue a ZQ calibration long (QCL) command or a ZQ calibration short (ZQCS) command. Accordingly, the semiconductor memory device may execute the ZQ calibration operation. In this case, the calibration result data of the ZQ calibration circuit 2200 may be generated.

At S940, the ZQ global managing circuit 1200 may receive the calibration result data through the I/O paths for each rank or for each module. When an equalizer circuit is applied to the semiconductor memory device, indication data providing notification that the equalizer circuit is used may be received together the calibration result data.

At S950, the ZQ global managing circuit 1200 may determine final ZQ values for each rank, for each module, or for each channel based on signal integrity (SI) characteristic information. In this case, the final ZQ values may be equalized. That is, in the case that the equalizer circuit 2550 is included in the semiconductor memory device, the driving force of the equalization operation may be applied in determining the final calibration value. In this case, ZQ calibration may be performed more finely.

On the other hand, the signal integrity (SI) information about a signal loading characteristic of a memory slot on which a memory module is mounted or SI information about a signal loading characteristic for each rank position in the memory module may be stored in a SI register 1210.

At S960, the ZQ global managing circuit 1200 may apply ZQ control data to the semiconductor memory device to finely adjust a variable offset resistor. That is, a final pull-up control signal FPUC and a final pull-down control signal FPDC may be outputted from the ZQ global control unit 1220, and the outputted final pull-up and pull-down control signals FPUC and FPDC may be provided to a corresponding semiconductor memory device. In this case, the ZQ calibration may be accurately performed in response to a SI characteristic difference finally.

Figure 10:
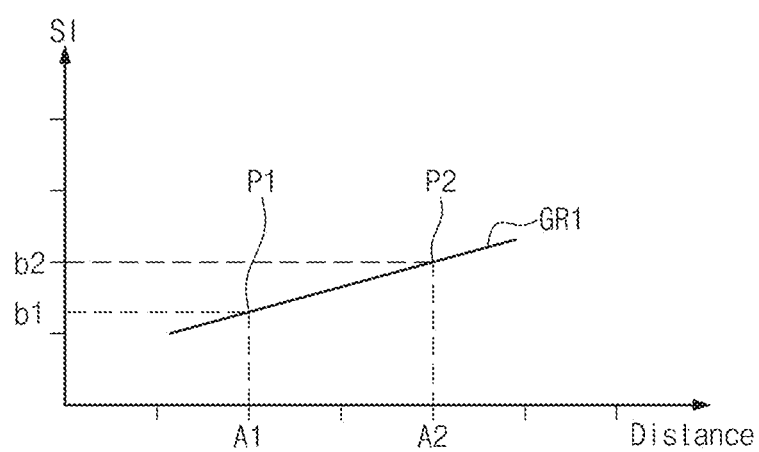
FIG. 10 is a graph illustrating a signal characteristic difference according to positions of slots on which memory modules are mounted.

FIG. 10 is a graph illustrating a signal characteristic difference according to positions of slots on which memory modules are mounted. Referring to FIG. 10, a horizontal axis denotes a distance of a memory slot arranged from the memory controller, and a vertical axis denotes signal integrity (SI). Referring to a graph GR1, it may be understood that SI characteristics of first and second memory slots are different from each other. That is, a SI value of the second memory slot further from the memory controller than the first memory slot may have a level of b2, and a SI value of the first memory slot may have a level of b1. As a result, SI characteristics may be different from each other based on positions of memory slots mounted on a circuit board. According to an embodiment of the inventive concept, the signal loading difference may be applied to be fit to a system environment under control of the memory controller.

Figure 11:
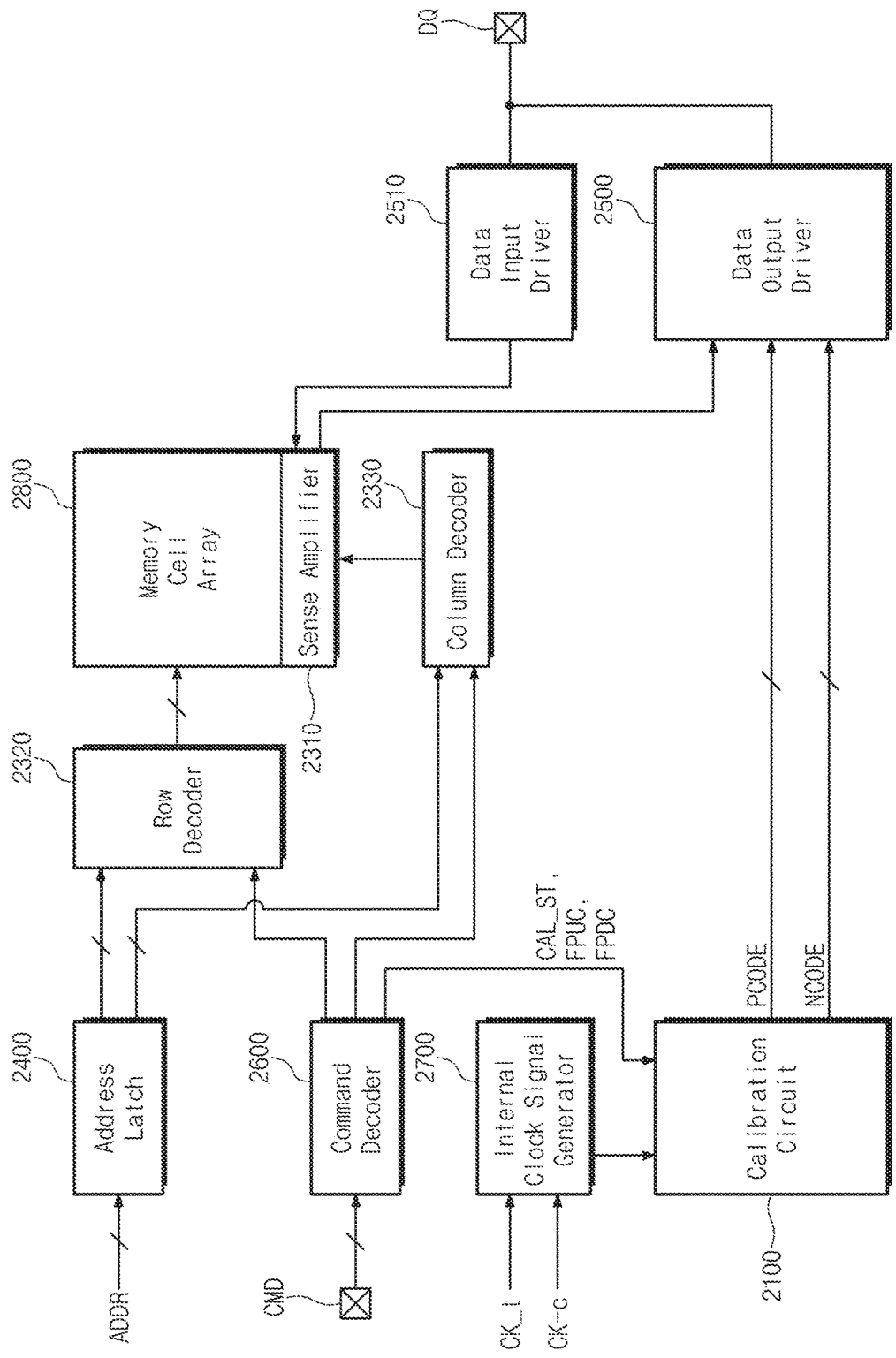
FIG. 11 is a detailed block diagram illustrating a semiconductor memory device according to an embodiment of the inventive concept.

FIG. 11 is a detailed block diagram illustrating a semiconductor memory device according to an embodiment of the inventive concept. Referring to FIG. 11, a semiconductor memory device 2000-1*i* may include an address latch 2400, a row decoder 2320, a column decoder 2330, a memory cell array 2800, a sense amplifier 2310, a command decoder 2600, an internal clock signal generator 2700, a calibration circuit 2100, a data input driver 2510, and a data output driver 2500, connected as illustrated.

The calibration circuit 2100 may perform a calibration operation in response to a calibration start signal CAL_ST. The pull-up calibration code PCODE and the pull-down calibration code NCODE may be outputted as calibration result data through the data output pad DQ. A final calibration value determined by the ZQ global control unit 1220 of FIG. 2 may be applied to the calibration circuit 2100 as the final pull-up control signal FPUC and the final pull-down control signal FPDC. The final pull-up control signal FPUC and the final pull-down control signal FPDC may finely change resistance values of offset variable resistors in the calibration circuit 2100. Thus, the impedance matching may be optimized according to the environment of the memory system.

The data output driver 2500 may output data stored in a memory cell array 2800 through the data output pad DQ. The data stored in the memory cell array 2800 may be provided to a data output driver 2500 through the sense amplifier 2310. In this case, the row decoder 2320 and the column decoder 2330 may provide an address ADDR of a memory cell, in which data to be output is stored, to the memory cell array 2800. The address ADDR of the memory cell may be provided to the row decoder 1320 and the column decoder 1330 through the address latch 2400.

Data applied to the semiconductor memory device may be provided to the data input driver 2510 through the output pad DQ. Data provided to the data input driver 2510 may be stored in the memory cell array 2800 through the sense amplifier 2310.

When data is stored in a memory cell, an address ADDR for selecting the memory cell may be provided through the address latch 2400, the row decoder 2320, and the column decoder 2330.

The command decoder 2600 may receive a variety of commands through a command pad CMD. The command decoder 2600 may provide a command to circuit blocks such as the row decoder 2320 and the column decoder 2330. In particular, the command decoder 2600 may provide the calibration start signal CAL_ST to the calibration circuit 2100. The calibration start signal CAL_ST may be a ZQ calibration long (ZQCL) command or a ZQ calibration short (ZQCS) command.

The internal clock signal generator 2700 may generate an internal clock signal based on an external clock signal CK_t/CK_c. In particular, the calibration circuit 2100 may perform a calibration operation in response to an internal clock signal generated by the internal clock generator 2700.

Figure 12:
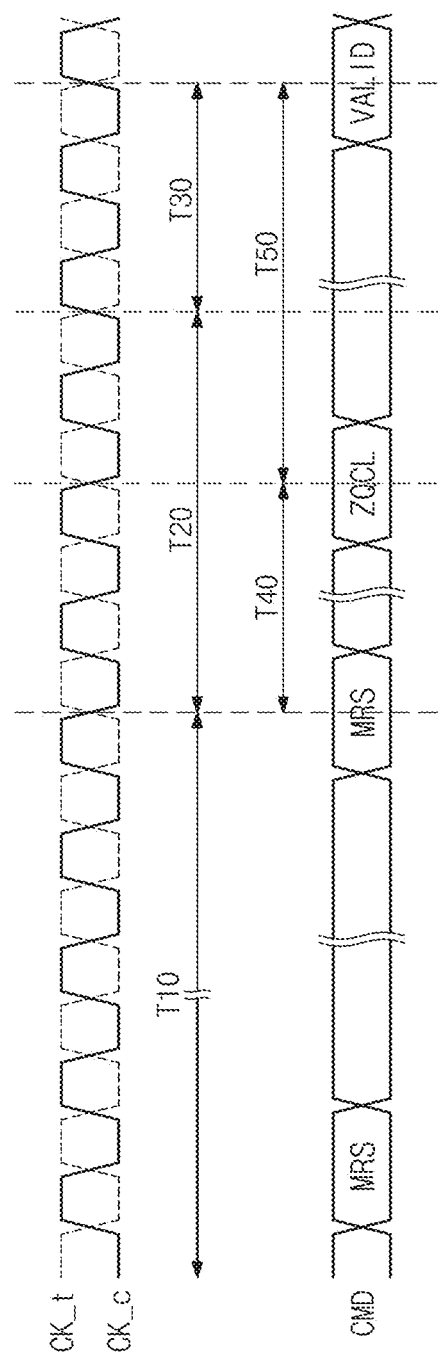
FIG. 12 is a timing diagram illustrating an operation of a semiconductor memory device according to an embodiment of the inventive concept.

FIG. 12 is a timing diagram illustrating an operation of a semiconductor memory device according to an embodiment of the inventive concept. Referring to FIG. 12, a first clock CK_t and a second clock CK_c which are in antiphase may be toggled. That is, the first clock CK_t and the second clock CK_c may be provided in the form of a differential signal.

A command CMD may include an MRS signal and a ZQ calibration command. A MRS command applied after a section T10 may be a command which allows the semiconductor memory device to output the calibration result. In this case, the semiconductor memory device may output ZQ calibration result data when a ZQ calibration operation in the semiconductor memory device is completed.

A command applied after a section T40 in a section T20 may be the ZQ calibration long (ZQCL) command. A semiconductor memory device which receives the ZQCL command may internally perform a ZQ calibration operation and may output the ZQ calibration result data to the memory controller during a section T30 in a section T50. A time corresponding to the section T30 may be sufficiently longer than a time taken to output the calibration result data to the memory controller. According to another embodiment of the inventive concept, a calibration may be exactly performed based on a signal loading characteristic for each memory slot or rank using the ZQ global managing circuit 1200.

As described above, an embodiment is disclosed by the drawings and specifications. Here, the terminology used herein is for the purpose of describing particular embodiments only and is not intended to limit the invention. Therefore, it will be understood that various modifications and other equivalent embodiments are possible from this point by those skilled in the art.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative.

What is claimed is:
1. A memory system, comprising:
   a memory module mounted on a memory slot and comprising a plurality of semiconductor memory devices each having a ZQ calibration circuit; and
   a memory controller configured to control the memory module, wherein the memory controller comprises a ZQ global managing circuit configured to receive calibration result data of the ZQ calibration circuit through the memory slot and to determine a final calibration value of the ZQ calibration circuit based on a signal loading characteristic of the memory slot on which the memory module is mounted.

2. The memory system of claim 1, wherein the calibration result data comprises a pull-up calibration code and a pull-down calibration code.

3. The memory system of claim 1, wherein the final calibration value is transmitted to the ZQ calibration circuit to control the ZQ calibration circuit.

4. The memory system of claim 1, wherein the calibration result data changed by the final calibration value is applied to an on-die termination operation of an on-die termination circuit.

5. The memory system of claim 1, wherein the ZQ global managing circuit comprises:
a signal integrity register configured to store signal integrity information based on a signal loading characteristic of the memory slot;
a ZQ code register configured to store the final calibration value; and
a ZQ global control unit configured to determine the final calibration value using the signal integrity information and the calibration result data.

6. The memory system of claim 1, wherein the ZQ global managing circuit comprises a variable offset resistance unit connected to a first calibration node.

7. The memory system of claim 6, wherein the variable offset resistance unit comprises a variable pull-up resistor and a variable pull-down resistor which are connected with the first calibration node interposed therebetween.

8. The memory system of claim 7, wherein a voltage of the first calibration node is adjusted when the variable pull-up resistor and the variable pull-down resistor are operated.

9. The memory system of claim 7, wherein the first calibration node is a node on which a ZQ pad voltage by a ZQ resistor appears.

10. The memory system of claim 1, wherein each of the semiconductor memory devices comprises an equalizer circuit configured to equalize an intensity of an input/output signal, and
wherein an equalizing characteristic of the equalizer circuit is further applied to the determined calibration value.

11. A memory system, comprising:
a memory module comprising a plurality of semiconductor memory devices each having a ZQ calibration circuit and mounted on one of a plurality of memory slots installed on a circuit board; and
a memory controller configured to control the plurality of semiconductor memory devices in the memory module for each rank,
wherein the memory controller comprises a ZQ global managing circuit configured to receive calibration result data of the ZQ calibration circuit through one of the plurality of memory slots and to determine a final calibration value for a ZQ fine control of the ZQ calibration circuit based on a signal loading characteristic for each rank position in the memory module.

12. The memory system of claim 11, wherein the ZQ calibration circuit comprises:
a ZQ resistor connected between a ZQ pad and a ground; and
a variable offset resister connected to the ZQ pad and configured to change a voltage of the ZQ pad.

13. The memory system of claim 11, wherein the ZQ global managing circuit comprises:
a signal integrity register configured to store signal integrity information based on the signal loading characteristic for each rank position;
a ZQ code register configured to store the final calibration value; and
a ZQ global control unit configured to determine the final calibration value using the signal integrity information and the calibration result data.

14. The memory system of claim 11, wherein the calibration result data of the ZQ calibration circuit is provided to the memory controller through input/output paths of the plurality of semiconductor memory devices by a mode register set command.

15. The memory system of claim 11, wherein the memory controller is an internal controller included in a host for processing data.

16. A memory system, comprising:
a memory module having a plurality of memory devices with corresponding ZQ calibration circuits therein; and
a memory controller electrically coupled to said memory module, said memory controller having a ZQ global managing circuit therein configured to determine a plurality of calibration values associated the corresponding ZQ calibration circuits in the plurality of memory devices, in response to calibration result data generated by the plurality of ZQ calibration circuits and said memory controller further configured to transfer the plurality of calibration values to the corresponding ZQ calibration circuits to support calibration operations within the plurality of memory devices in said memory module;
wherein said memory module is mounted within a memory slot; and
wherein the plurality of calibration values account for signal loading characteristics of said memory module within the memory slot.

17. The memory system of claim 16, wherein the calibration result data for each of the plurality of memory devices includes a pull-up calibration code and a pull-down calibration code.

18. The memory system of claim 16, wherein the calibration result data is modified by the plurality of calibration values and then used during an on-die termination operation associated with on-die termination circuits.

19. The memory system of claim 16, wherein the ZQ global managing circuit comprises:
a signal integrity register configured to store signal integrity information based on signal loading characteristics of the memory slot;
a ZQ code register configured to store the plurality of calibration values; and
a ZQ global control circuit configured to determine the plurality of calibration values from at least the signal integrity information and the calibration result data.

* * * * *